US012155369B2

(12) United States Patent
Nishimura et al.

(10) Patent No.: US 12,155,369 B2
(45) Date of Patent: Nov. 26, 2024

(54) RESONATOR AND RESONANCE DEVICE FOR VIBRATING IN A CONTOUR VIBRATION MODE

(71) Applicant: Murata Manufacturing Co., Ltd., Nagaokakyo (JP)

(72) Inventors: Toshio Nishimura, Nagaokakyo (JP); Ville Kaajakari, Helsinki (FI)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 692 days.

(21) Appl. No.: 17/478,437

(22) Filed: Sep. 17, 2021

(65) Prior Publication Data
US 2022/0006442 A1 Jan. 6, 2022

Related U.S. Application Data

(63) Continuation of application No. PCT/JP2019/048616, filed on Dec. 12, 2019.

(60) Provisional application No. 62/836,299, filed on Apr. 19, 2019.

(51) Int. Cl.
H03H 9/24 (2006.01)
H03H 9/17 (2006.01)
H03H 3/013 (2006.01)

(52) U.S. Cl.
CPC .............. *H03H 9/24* (2013.01); *H03H 9/171* (2013.01); *H03H 3/013* (2013.01)

(58) Field of Classification Search
CPC ...... H03H 9/24; H03H 9/171; H03H 9/02157; H03H 9/02338; H03H 9/1057; H03H 9/0595; H03H 3/013; H03H 2009/0244; H10N 30/85
See application file for complete search history.

(56) References Cited

U.S. PATENT DOCUMENTS

| 4,649,310 A | 3/1987 | Nakamura et al. |
| 8,810,112 B2* | 8/2014 | Takahashi ............ H03H 9/1035 310/365 |
| 10,715,103 B2 | 7/2020 | Hirota et al. |

(Continued)

FOREIGN PATENT DOCUMENTS

| CN | 108141197 A | 6/2018 |
| JP | S60137112 A | 7/1985 |

(Continued)

OTHER PUBLICATIONS

International Search Report issued for PCT/JP2019/048616, date of mailing Feb. 18, 2020.

(Continued)

*Primary Examiner* — Emily P Pham
(74) *Attorney, Agent, or Firm* — ArentFox Schiff LLP

(57) ABSTRACT

A resonator is provided that includes a vibration member that includes a substrate, a metal layer formed along one of main surfaces of the substrate, and a piezoelectric thin film disposed between the substrate and the metal layer. The vibration member vibrates such that a main vibration is a contour vibration. Moreover, a frame surrounds at least a portion of the vibration member, and a support unit connects the vibration member to the frame. The vibration member includes depressed portions on or above the one of main surfaces where the piezoelectric thin film is removed.

20 Claims, 11 Drawing Sheets

(56) References Cited

U.S. PATENT DOCUMENTS

| | | |
|---|---|---|
| 2008/0024042 A1 | 1/2008 | Isobe et al. |
| 2018/0205363 A1 | 7/2018 | Hirota et al. |
| 2019/0074811 A1 | 3/2019 | Nishimura |
| 2019/0109578 A1 | 4/2019 | Goto et al. |

FOREIGN PATENT DOCUMENTS

| | | |
|---|---|---|
| JP | 3139274 B2 | 2/2001 |
| JP | 2006352854 A | 12/2006 |
| JP | 2008035358 A | 2/2008 |
| JP | 2008236440 A | 10/2008 |
| JP | 2009094560 A | 4/2009 |
| JP | 2010141570 A | 6/2010 |
| JP | 2015087284 A | 5/2015 |
| WO | 2017203741 A1 | 11/2017 |
| WO | 2018008480 A1 | 1/2018 |

OTHER PUBLICATIONS

Written Opinion of the International Searching Authority issued for PCT/JP2019/048616, date of mailing Feb. 18, 2020.

\* cited by examiner

FIG.10
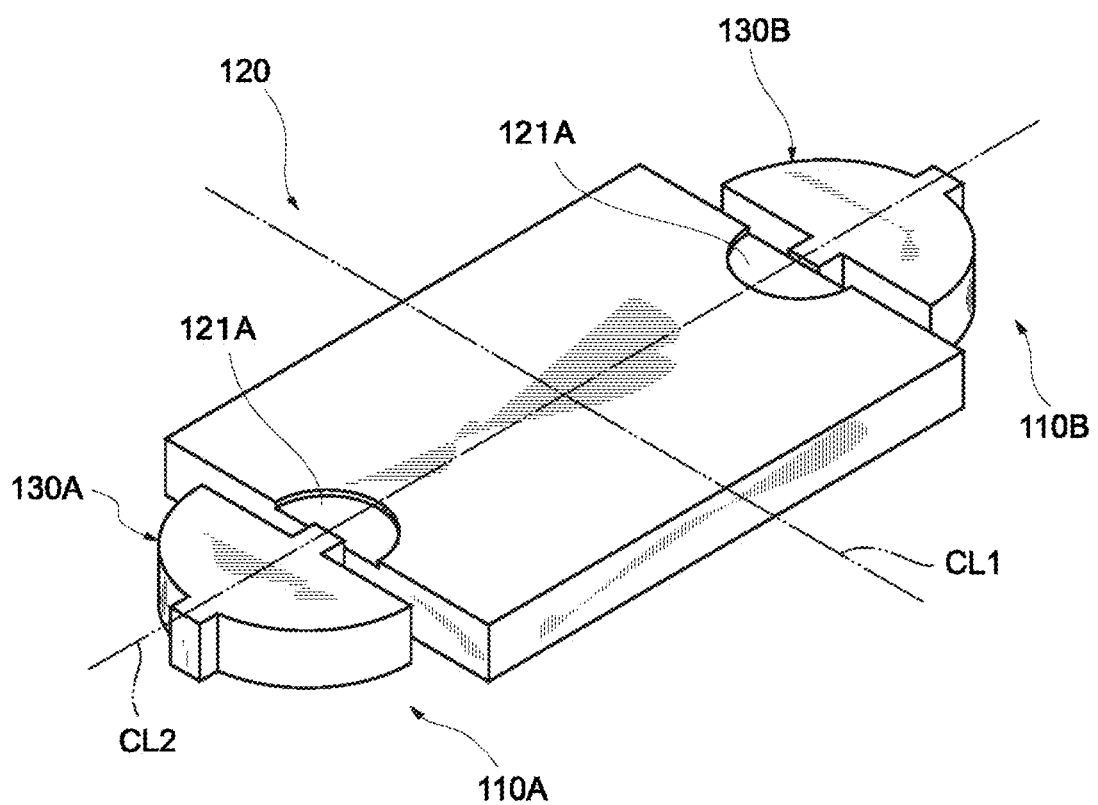
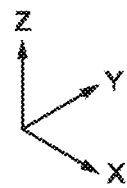

RESONATOR AND RESONANCE DEVICE FOR VIBRATING IN A CONTOUR VIBRATION MODE

CROSS REFERENCE TO RELATED APPLICATIONS

The present application is a continuation of PCT/JP2019/048616 filed Dec. 12, 2019, which claims priority to U.S. Provisional Patent Application No. 62/836,299, filed Apr. 19, 2019, the entire contents of each of which are incorporated herein by reference.

TECHNICAL FIELD

The present invention relates to a resonator that vibrates in a contour vibration mode, and a resonance device.

BACKGROUND

Currently, resonance devices for which a MEMS (Micro Electro Mechanical Systems) technique is used can be provided as timing devices, for example. In an example, the resonance device is mounted on a printed circuit board that is incorporated in an electronic device such as a smart phone. The resonance device includes a lower substrate, an upper substrate that defines a cavity together with the lower substrate, and a resonator that is disposed in the cavity between the lower substrate and the upper substrate.

For example, Japanese Patent No. 3139274 (hereinafter "Patent Document 1") discloses a vibrator that uses a width expansion mode and that includes a piezoelectric body that has a rectangular cuboid shape, resonant electrodes that are formed on the outer surface of the piezoelectric body, and a resonant portion in which a ratio b/a of the length of a long side to the length of a short side is within ±10% of a predetermined value where a is the length of the short side of each of a pair of rectangular surfaces of the piezoelectric body in a polarization direction, b is the length of the long side thereof, and σ is the Poisson's ratio of the material of the piezoelectric body, and in which the width expansion mode a width direction that coincides with the direction of the short side is excited when an alternating voltage is applied across the resonant electrodes.

Since the vibrator disclosed in Patent Document 1 has the electrodes that are formed on both main surfaces of the piezoelectric body, the structure of the vibrator in a thickness direction can be symmetrical.

In the case where an electrode is formed on one of main surfaces of a substrate, however, the structure of a vibratile vibration member in the thickness direction, for example, a Z-axis direction is asymmetrical. Accordingly, when the vibration member bends in the Z-axis direction, a support member that connects the vibration member and a holding member to each other moves in the Z-axis direction. Consequently, vibrations of the vibration member leak to the hold member via the support member, and the effect of confining the vibrations is reduced.

SUMMARY OF THE INVENTION

Thus, it is an object of the present invention to provide a resonator and a resonance device that enable the effect of confining vibrations to be enhanced.

Accordingly, a resonator is provided according to an exemplary aspect that includes a vibration member having a substrate, a first electrode formed along one of main surfaces of the substrate, and a piezoelectric layer disposed between the substrate and the first electrode. The vibration member vibrates such that a main vibration is a contour vibration. Moreover, a frame surrounds at least a portion of the vibration member, and a support member connects the vibration member and the frame to each other. The vibration member includes a depressed portion on or above the one of main surfaces where the piezoelectric layer is removed.

Moreover, a resonance device is provided according to an exemplary aspect that includes the resonator described above, and a lid.

According to the present invention, the effect of confining vibrations can be enhanced according to the exemplary aspects.

BRIEF DESCRIPTION OF DRAWINGS

FIG. 10 is a perspective view of a first modification to a structure around the vibration member illustrated in FIG. 3.

DETAILED DESCRIPTION OF EMBODIMENTS

Exemplary embodiments of the present invention will hereinafter be described. In the following description for the drawings, like or similar components are designated by like or similar reference signs. The drawings are example, the dimensions and shapes of components are schematically illustrated, and it should not be understood that the technical scope of the present invention is limited to that of the embodiment.

Exemplary Embodiment

Figure 1:
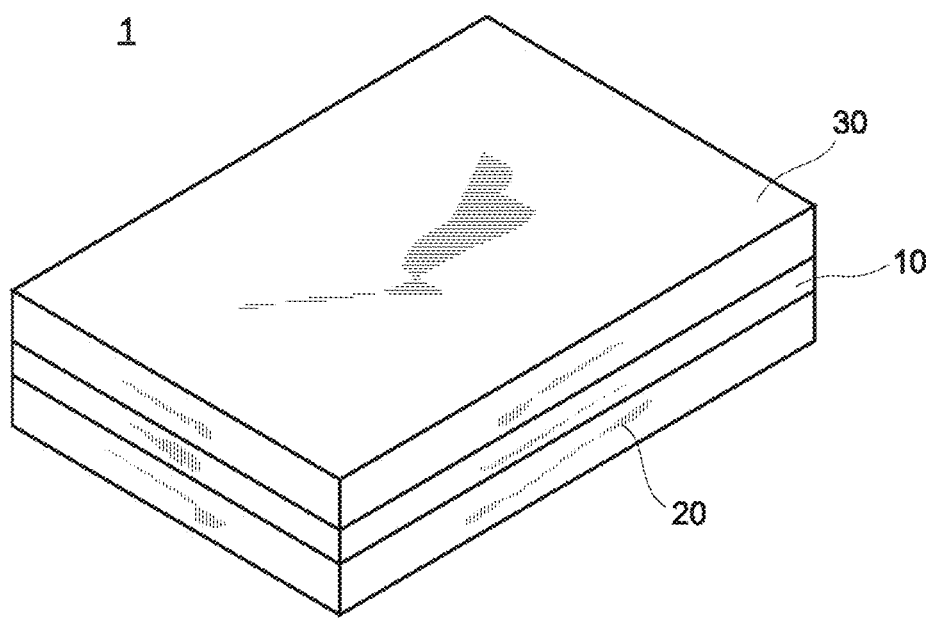
FIG. 1 schematically illustrates a perspective view of a resonance device according to an exemplary embodiment.
Figure 2:
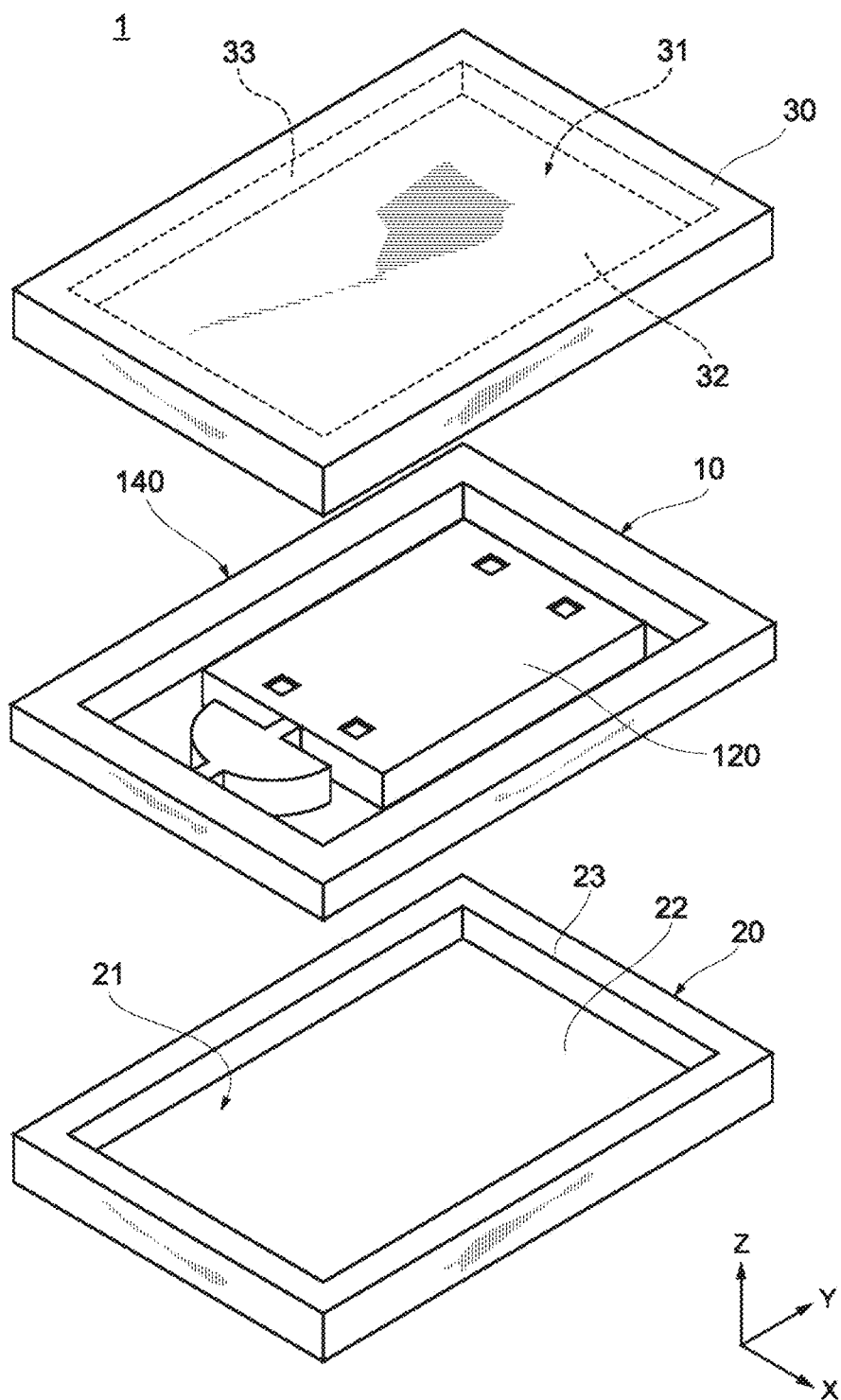
FIG. 2 schematically illustrates an exploded perspective view of the structure of the resonance device illustrated in FIG. 1.

A schematic structure of a resonance device according to an exemplary embodiment will be described with reference to FIG. 1 and FIG. 2. FIG. 1 schematically illustrates a perspective view of a resonance device 1 according to an exemplary embodiment. FIG. 2 schematically illustrates an exploded perspective view of the structure of the resonance device 1 illustrated in FIG. 1.

As shown, the resonance device 1 includes a resonator 10, a lower lid 20, and an upper lid 30. That is, the resonance device 1 includes the lower lid 20, the resonator 10, and the upper lid 30 that are stacked in this order. The lower lid 20 and the upper lid 30 according to the present embodiment correspond to examples of a "lid" for purposes of this disclosure.

The structure of the resonance device 1 will now be described. In the following description, the upper lid 30 of the resonance device 1 is disposed on an upper side (or a front side), and the lower lid 20 is disposed on a lower side (or a back side).

In an exemplary aspect, the resonator 10 is a MEMS vibrator that is manufactured using a MEMS technique. The resonator 10 is joined to the lower lid 20 and the upper lid 30. The resonator 10, the lower lid 20, and the upper lid 30 are formed by using respective silicon (Si) substrates (referred to below as "Si substrates"). The Si substrates are joined to each other. The resonator 10 and the lower lid 20 may be formed by using SOI substrates in exemplary aspects.

The upper lid 30 extends along a XY plane into a plate shape. On a back surface thereof, a depressed portion 31 in the form of, for example, a flat rectangular cuboid is formed. The depressed portion 31 is surrounded by a side wall 33 and forms a part of a vibration space in which the resonator 10 vibrates. The upper lid 30 may not include the depressed portion 31 and may have a plate shape. A getter layer may be formed on a surface of the depressed portion 31 of the upper lid 30 that faces the resonator 10.

The lower lid 20 includes a bottom plate 22 that is disposed along the XY plane and that has a rectangular plate shape and a side wall 23 that extends from a circumferential portion of the bottom plate 22 in a Z-axis direction, that is, a direction in which the lower lid 20 and the resonator 10 are stacked. A depressed portion 21 is formed on a surface of the lower lid 20 that faces the resonator 10 by a front surface of the bottom plate 22 and the inner surface of the side wall 23. The depressed portion 21 forms a part of the vibration space of the resonator 10. In one aspect, the lower lid 20 may not include the depressed portion 21 and may have a plate shape. A getter layer may be formed on a surface of the depressed portion 21 of the lower lid 20 that faces the resonator 10.

The vibration space of the resonator 10 is sealed in an airtight state by the upper lid 30 and the lower lid 20 described above, and a vacuum state is maintained. The vibration space may be filled with gas such as inert gas.

Figure 3:
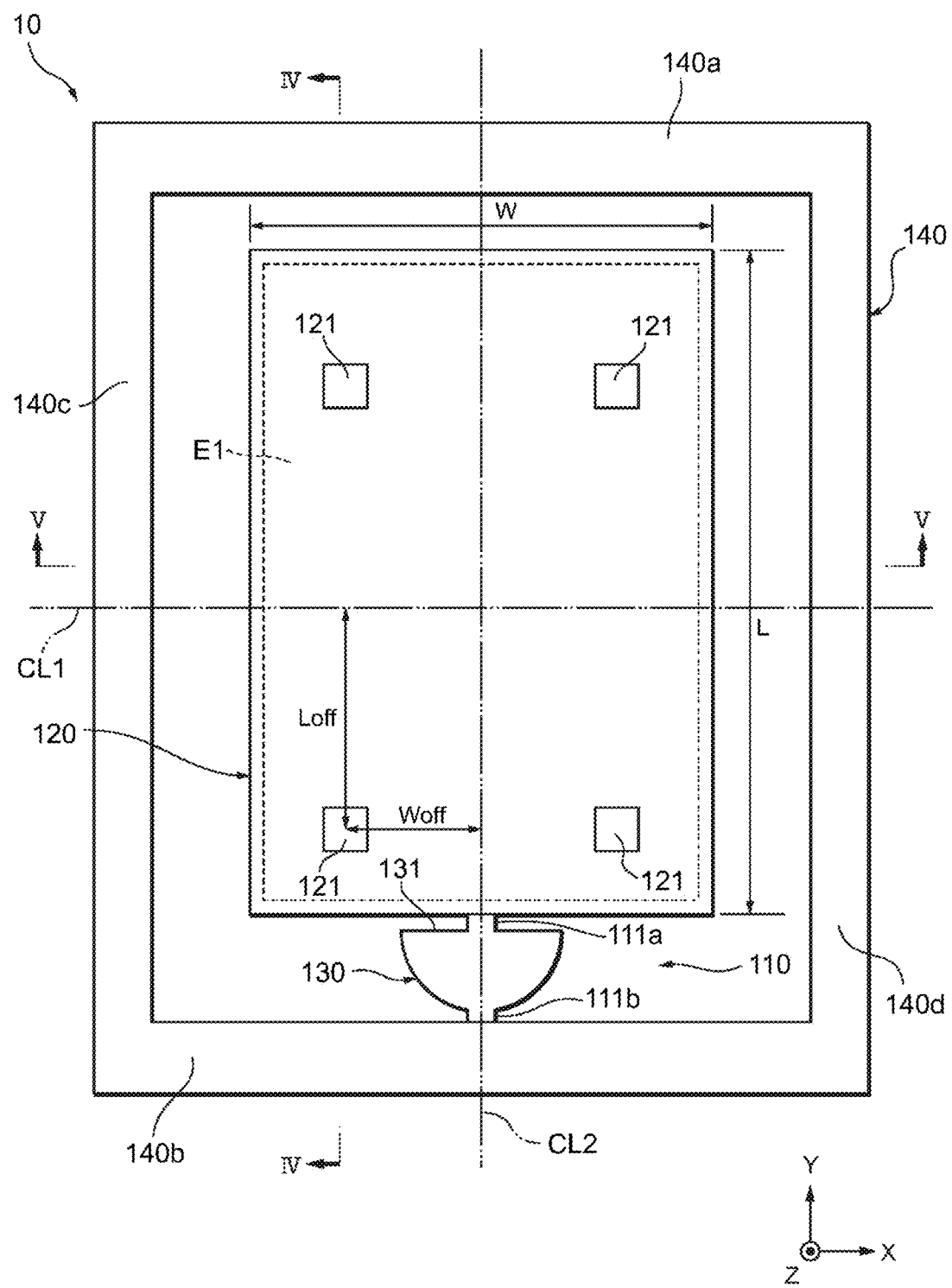
FIG. 3 schematically illustrates a plan view of the structure of a resonator illustrated in FIG. 2.

A schematic structure of the resonator 10 according to an exemplary embodiment will now be described with reference to FIG. 3. FIG. 3 schematically illustrates a plan view of the structure of the resonator 10 illustrated in FIG. 2.

As illustrated in FIG. 3, the resonator 10 is the MEMS vibrator that is manufactured by using the MEMS technique. The resonator 10 includes a vibration member 120, a hold member 140 (i.e., a frame), and a support unit 110 (e.g., a connecting arm). The support unit 110 according to the present embodiment corresponds to an example of a "support member" according to the present disclosure.

The vibration member 120 has a rectangular contour that extends along the XY plane of a rectangular coordinate system illustrated in FIG. 3 in a plan view of a surface that faces the upper lid 30. The vibration member 120 is disposed inside the hold member 140 or frame. Moreover, a space is formed as a predetermined gap between the vibration member 120 and the hold member 140.

As illustrated in FIG. 3, the vibration member 120 has main surfaces that have a length L in a Y-axis direction and a width W in an X-axis direction in a plan view. The aspect ratio (i.e., the dimension ratio) of the vibration member 120 is expressed by using the length L relative to the width W, that is, L/W. For example, the length L is about 171 μm, and the width W is about 120 μm. In this case, the aspect ratio L/W is about 1.425, for example.

Moreover, the vibration member 120 includes a metal layer E1. The metal layer E1 has a shape along the contour of the vibration member 120. In a plan view, the length of the metal layer E1 in the Y-axis direction is substantially equal to the length L of the vibration member 120, and the width thereof in the X-axis direction is substantially equal to the width W of the vibration member 120. The metal layer E1 is not limited by the shape along the contour of the vibration member 120, provided that the metal layer E1 extends from an end to another end of the vibration member 120 in the Y-axis direction. The metal layer E1 according to the present embodiment corresponds to an example of a "first electrode" of the exemplary aspect.

Moreover, a protection film 125 is formed on a front surface (e.g., the surface that faces the upper lid 30) of the vibration member 120 so as to cover the entire surface. The protection film 125 will be described later in detail.

For example, the vibration member 120 includes four depressed portions 121 (i.e., depressions). According to the exemplary aspect, each depressed portion 121 has a square shape in a plan view, and the length of each side is about 9 μm, for example.

As shown, each depressed portion 121 is located at a position an offset away from the center of the vibration member 120 in a plan view. That is, each depressed portion 121 is formed at a position a length Loff away from a center line CL1 in the Y-axis direction on the vibration member 120. Each depressed portion 121 is formed at a position a width Woff away from a center line CL2 in the X-axis direction on the vibration member 120.

The offset ratio of each depressed portion 121 in the Y-axis direction is expressed as the length Loff relative to the length L of the vibration member 120, that is, Loff/L. The offset ratio in the Y-axis direction is, for example, about 0.4. Moreover, the offset ratio of each depressed portion 121 in the X-axis direction is expressed as the width Woff relative to the width W of the vibration member 120, that is, Woff/W. The offset ratio in the X-axis direction is, for example, about 0.2.

The hold member 140 (or frame) is formed into a rectangular frame shape so as to surround an outer side portion of the vibration member 120 along the XY plane. The hold member 140 is not limited by the frame shape, provided that the hold member 140 is disposed so as to surround at least a portion around the vibration member 120. For example, the hold member 140 may be disposed around the vibration member 120, such that the hold member 140 holds the vibration member 120 and can be joined to the upper lid 30 and the lower lid 20.

According to the present embodiment, the hold member 140 includes frame bodies 140a to 140d that are integrally formed and that have a prismatic shape. As illustrated in FIG. 3, the frame bodies 140a and 140b face short sides of the vibration member 120, and the longitudinal direction thereof is parallel to the X-axis direction. The frame bodies 140c and 140d face long sides of the vibration member 120, the longitudinal direction thereof is parallel to the Y-axis direction, ends thereof are connected to ends of the frame bodies 140a and 140b. The frame body 140b is connected at a position near the center thereof by using the support unit 110.

The support unit 110 is disposed in a space inside the hold member 140 between one of the short sides of the vibration member 120 and the frame body 140b. The support unit 110 can be configured as a connecting arm that connects the short side of the vibration member 120 and the frame body 140b of the hold member 140. The metal layer E1 described above extends on a front surface of the support unit 110 from the vibration member 120 to the frame body 140b although an illustration is omitted.

The support unit 110 according to the present embodiment includes a node generator 130. The node generator 130 is connected to the short side of the vibration member 120 by using an arm 111a and is connected to the frame body 140b of the hold member 140 by using an arm 111b. The node generator 130 has a side 131 that faces the short side of the vibration member 120 and is connected to the arm 111a at the side 131.

As shown, the node generator 130 has a shape such that a width in the X-axis direction decreases in the direction from the arm 111a toward the arm 111b. The node generator 130 has a shape line-symmetrical with respect to the perpendicular bisector of the side 131. As for the node generator 130, a position at which a width in the X-axis direction is the maximum is nearer than the center in the Y-axis direction to the arm 111a. According to the present embodiment, the width of the node generator 130 in the Y-axis direction is the maximum at the side 131, gradually decreases in the direction from the arm 111a toward the arm 111b, and is the minimum at a position at which the vertex of the node generator 130 and the arm 111b are connected to each other. It is noted that the width of the node generator 130 in the Y-axis direction does not necessarily decrease continuously. For example, the width may decrease stepwise or partly increase, provided that the width gradually decreases as a whole. Edges of the node generator 130 are not limited by a smooth shape and may have unevenness in alterative aspects.

According to the present embodiment, the node generator 130 has a semicircular shape that has, for example a diameter corresponding to the side 131 and a radius of about 30 μm. In this case, the center of a circle that defines the arc of the node generator 130 is located at the center of the side 131. The center of the circle that defines the arc of the node generator 130 may be located at the center of the arm 111b. The side 131 is not limited by a linear shape and may have an arc shape. In this case, the arm 111a is connected to the vertex of the side 131. Moreover, the center of a circle that defines the arc of the side 131 may be located near the arm 111a or may be located near the arm 111b. The length of the side 131 is preferably more than the width of the arm 111a in the X-axis direction and is preferably less than the short sides of the vibration member 120.

The node generator 130 of the support unit 110 according to the present embodiment has a structure in which the width in the X-axis direction gradually decreases in the direction from the arm 111a toward the arm 111b. For this reason, the node generator 130 includes a portion that moves a small amount and that is adjacent to a portion that moves a large amount due to a vibration even in the case where the transmission state of vibrations that are transmitted from the vibration member 120 changes. This configuration enables the node generator 130 to adjust the moving portions against vibrations that leak from the vibration member 120 and enables a vibration node to be formed on the node generator 130. At the formed node, the node generator 130, which is connected to the arm 111a, inhibits the vibrations from being transmitted from the vibration member 120 to the hold member 140. Consequently, the anchor loss of the resonator 10 can be reduced, and a Q factor can be improved.

Figure 4:
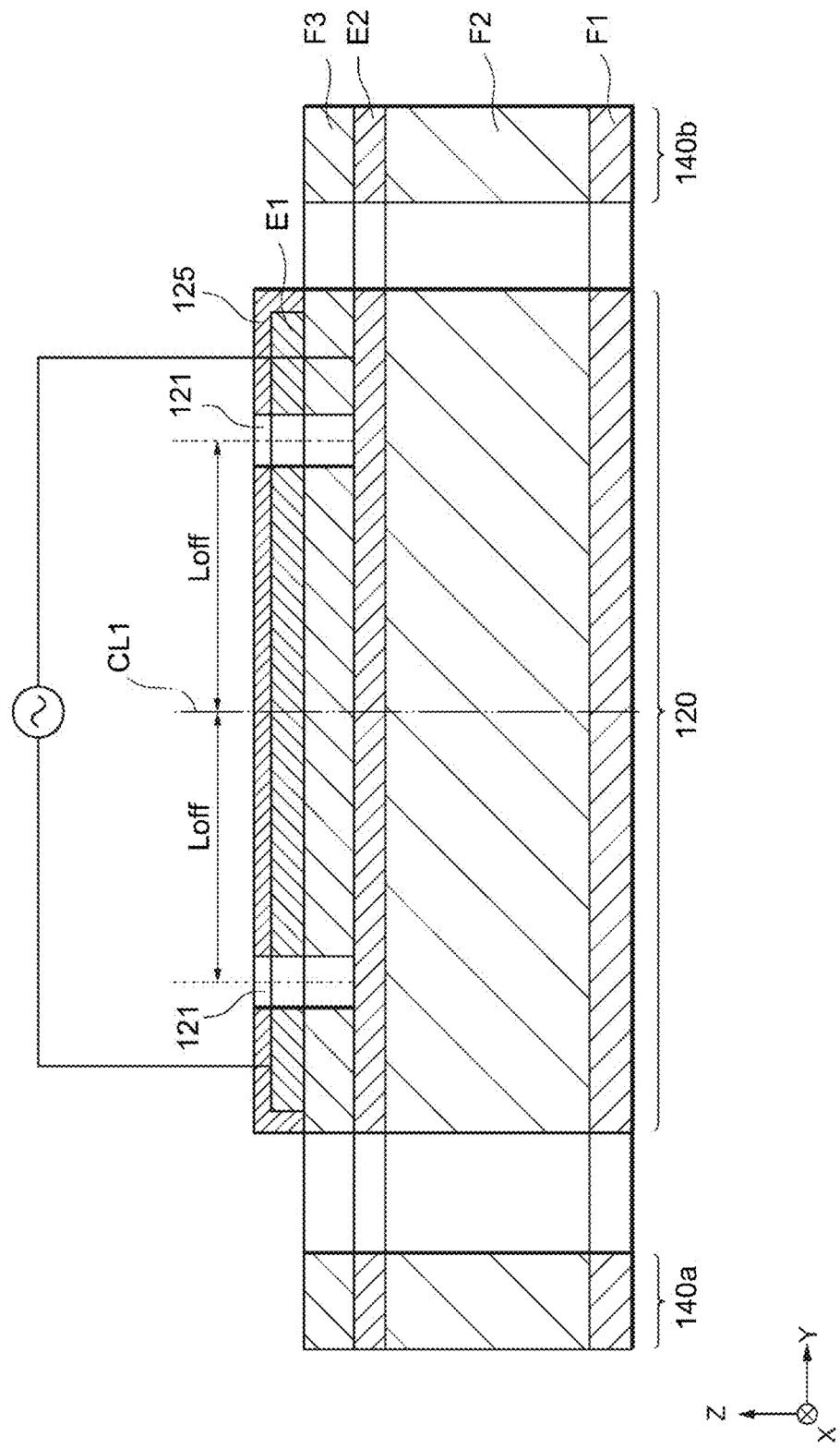
FIG. 4 schematically illustrates a sectional view of the structure of a section taken along line IV-IV illustrated in FIG. 3.
Figure 5:
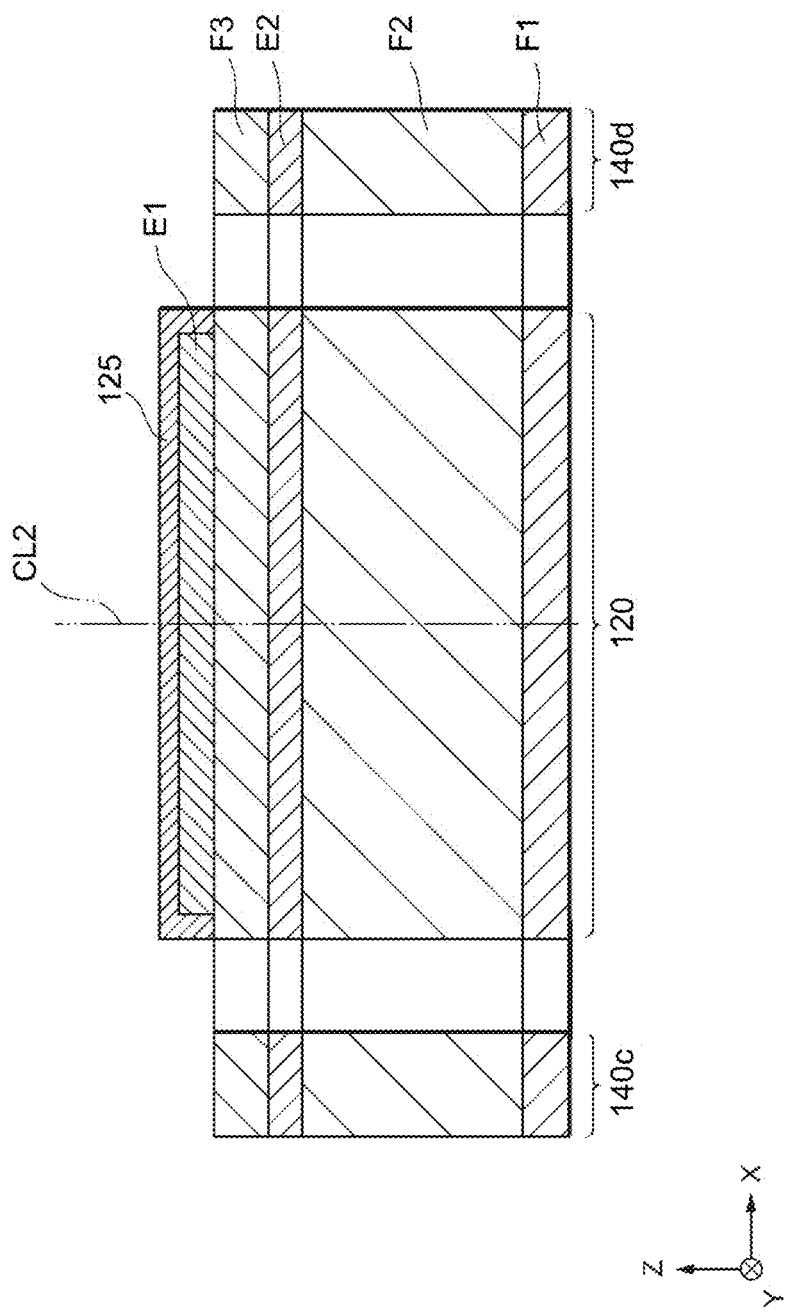
FIG. 5 schematically illustrates a sectional view of the structure of a section taken along line V-V illustrated in FIG. 3.

The multilayer structure of the resonator 10 according to an exemplary embodiment will now be described with reference to FIG. 4 to FIG. 5. FIG. 4 schematically illustrates a sectional view of the structure of a section taken along line IV-IV illustrated in FIG. 3. FIG. 5 schematically illustrates a sectional view of the structure of a section taken along line V-V illustrated in FIG. 3.

Preferably, the vibration member 120, the hold member 140, and the support unit 110 of the resonator 10 are integrally formed by the same process. As illustrated in FIG. 4, as for the vibration member 120 of the resonator 10, a metal layer E2 is stacked on one of main surfaces, that is, an upper surface of a silicon (Si) substrate (referred to below as a "Si substrate") F2 that has a thickness of, for example, about 24 μm. A piezoelectric thin film F3 is stacked on the metal layer E2 so as to cover the metal layer E2. The metal layer E1 is stacked on the piezoelectric thin film F3. The protection film 125 is stacked on the metal layer E1 so as to cover the metal layer E1. The Si substrate F2 according to the present embodiment corresponds to an example of a "substrate", and the piezoelectric thin film F3 according to the present embodiment corresponds to an example of a "piezoelectric layer".

The vibration member 120 includes the piezoelectric thin film F3 that is disposed between the Si substrate F2 and the metal layer E1 that is formed along the upper surface of the Si substrate F2.

Since the material of the substrate of the vibration member 120 is silicon (Si) as described above, the mechanical strength of the vibration member 120 can be increased.

In an exemplary aspect, the Si substrate F2 may be composed of a degenerate n-type silicon (Si) semiconductor. Degenerate silicon (Si) can contain a n-type dopant such as phosphorus (P), arsenic (As), or antimony (Sb). The resistance value of the degenerate silicon (Si) that is used for the Si substrate F2 is, for example, less than 16 mΩ·cm, preferably 1.2 mΩ·cm or less.

Since the material of the substrate of the vibration member 120 is the degenerate silicon (Si), the frequency and temperature characteristics of the vibration member 120 can be improved.

A compensation layer F1 is formed on the other main surface, that is, a lower surface of the Si substrate F2. The compensation layer F1 has a thickness of, for example, about 0.5 μm and is composed of, for example, silicon dioxide ($SiO_2$).

According to the present embodiment, the compensation layer F1 means a layer that has a function of decreasing the temperature coefficient of frequency, that is, a ratio of change in frequency per temperature in the vibration member 120 in which the compensation layer is formed on the Si substrate F2 at least at a temperature close to normal temperature unlike the case where the compensation layer F1 is not formed on the Si substrate F2. In the case where the vibration member 120 includes the compensation layer F1, the change due to the temperature can be reduced, for example, at the resonant frequency of a multilayer structure that includes the Si substrate F2, the metal layer E1, the piezoelectric thin film F3, and the compensation layer F1, and the temperature characteristics of the vibration member 120 can be improved.

Moreover, the metal layers E1 and E2 have a thickness of, for example, roughly 0.2 μm or less and are patterned into desired shapes by, for example, etching after being formed. For the metal layers E1 and E2, metal the crystal structure of which is a body-centered cubic structure is used. Specifically, the metal layer E1 is composed of, for example, Mo (molybdenum) or tungsten (W).

In the exemplary aspect, the metal layer E1, for example, in the vibration member 120 functions as an upper electrode. The metal layer E1 on the support unit 110 and the hold member 140 functions as a wiring line that connects the upper electrode to an AC power supply that is disposed outside the resonator 10.

Moreover, the metal layer E2 in the vibration member 120 functions as a lower electrode. The metal layer E2 on the support unit 110 or the hold member 140 functions as a wiring line that connects the lower electrode to a circuit that is disposed outside the resonator 10.

In one exemplary aspect, the Si substrate F2 itself can function as the lower electrode, and the metal layer E2 can be omitted.

The piezoelectric thin film F3 converts an applied voltage into vibration. The piezoelectric thin film F3 is composed of a material that has a wurtzite hexagon crystal structure, and the main component thereof can be, for example, a nitride or an oxide such as nitride aluminum (AlN), scandium aluminum nitride (ScAlN), zinc oxide (ZnO), gallium nitride (GaN), or indium nitride (InN). The scandium aluminum nitride is obtained by replacing a part of aluminum in nitride aluminum with scandium. The part may be replaced with two elements of, for example, magnesium (Mg) and niobium (Nb) or magnesium (Mg) and zirconium (Zr) instead of scandium. The thickness of the piezoelectric thin film F3 is, for example, 0.8 μm and can be about 0.2 μm to 2 μm.

The piezoelectric thin film F3 faces the Si substrate F2 in a direction of a c axis, that is, the thickness direction thereof (the Z-axis direction).

Examples of the protection film 125 include a piezoelectric film composed of, for example, nitride aluminum (AlN), scandium aluminum nitride (ScAlN), zinc oxide (ZnO), gallium nitride (GaN), or indium nitride (InN), and an insulating film composed of, for example, silicon nitride (SiN), silicon dioxide (SiO$_2$), or alumina oxide (Al$_2$O$_3$). The thickness of the protection film 125 is, for example, about 0.2 μm. In the case where the vibration member 120 includes the protection film 125, the metal layer E1 that functions as the upper electrode for piezoelectric vibration, for example, can be prevented from being oxidized.

As shown, each depressed portion 121 is formed in the vibration member 120 such that parts of the protection film 125, the metal layer E1, and the piezoelectric thin film F3 stacked on the metal layer E2 are removed by, for example, etching.

In other words, each depressed portion 121 causes the metal layer E2 to be exposed at the bottom surface thereof.

In the case where the Si substrate F2 is also used as the lower electrode, and the metal layer E2 is omitted as described above, parts of the protection film 125, the metal layer E1, and the piezoelectric thin film F3 stacked on the Si substrate F2 are removed and each depressed portion 121 is formed by, for example, etching. In other words, each depressed portion 121 causes the upper surface of the Si substrate F2 to be exposed at the bottom surface thereof.

The vibration member 120 has a vibration region corresponding to the metal layer E1 that functions as the upper electrode. As illustrated in FIG. 4, in the vibration region, the piezoelectric thin film F3 expands and contracts in the in-plane direction of the XY plane, that is, the Y-axis direction depending on an electric field that is applied to the piezoelectric thin film F3 by the metal layer E1 and the metal layer E2. Specifically, since the piezoelectric thin film F3 faces in the thickness direction, when a predetermined electric field is applied to the metal layer E1 and the metal layer E2, and a predetermined electric potential difference is generated between the metal layer E1 and the metal layer E2, the piezoelectric thin film F3 causes contour vibration in an XY in-plane direction depending on the electric potential difference. That is, in the vibration region of the vibration member 120, vibrations in an expansion-contraction mode occur such that the expansion of the vibration member 120 and the contraction of the vibration member 120 are repeated in the length direction (i.e., the Y-axis direction).

The vibration member 120 vibrates such that a main vibration is the contour vibration but has an asymmetrical structure in the thickness direction (i.e., the Z-axis direction), for example, because of the metal layer E1 and the metal layer E2 formed on the one of the main surfaces (e.g., the upper surface in FIG. 4) of the Si substrate F2. Accordingly, the vibration member 120 is likely to bend in the thickness direction due to the contour vibration.

The vibration member 120 according to the present embodiment, however, includes the depressed portions 121 on or above the one of the main surfaces of the Si substrate F2 where the piezoelectric thin film F3, the metal layer E1, and the protection film 125 are removed, and this enables the form of the movement of the vibration member 120 in the thickness direction to be adjusted. Accordingly, the vibrations can be inhibited from leaking to the hold member 140, and the confining effect can be enhanced.

As illustrated in FIG. 3, each depressed portion 121 is formed at the position the offset away from the center line CL2 in the X-axis direction perpendicular to the Y-axis direction on the Si substrate F2 in a plan view of the one of the main surfaces of the Si substrate F2 (simply referred to below as "in a plan view"). This configuration enables the form of the movement of the vibration member 120 in the thickness direction to be readily adjusted.

In the present disclosure, the term "contour vibration" is used as a general term of an expansion vibration, a width expansion vibration by which a dimension in the width direction (i.e., the X-axis direction) varies, and an expansion-contraction vibration that causes expansion and contraction in the length direction (i.e., Y-axis direction).

Figure 6:
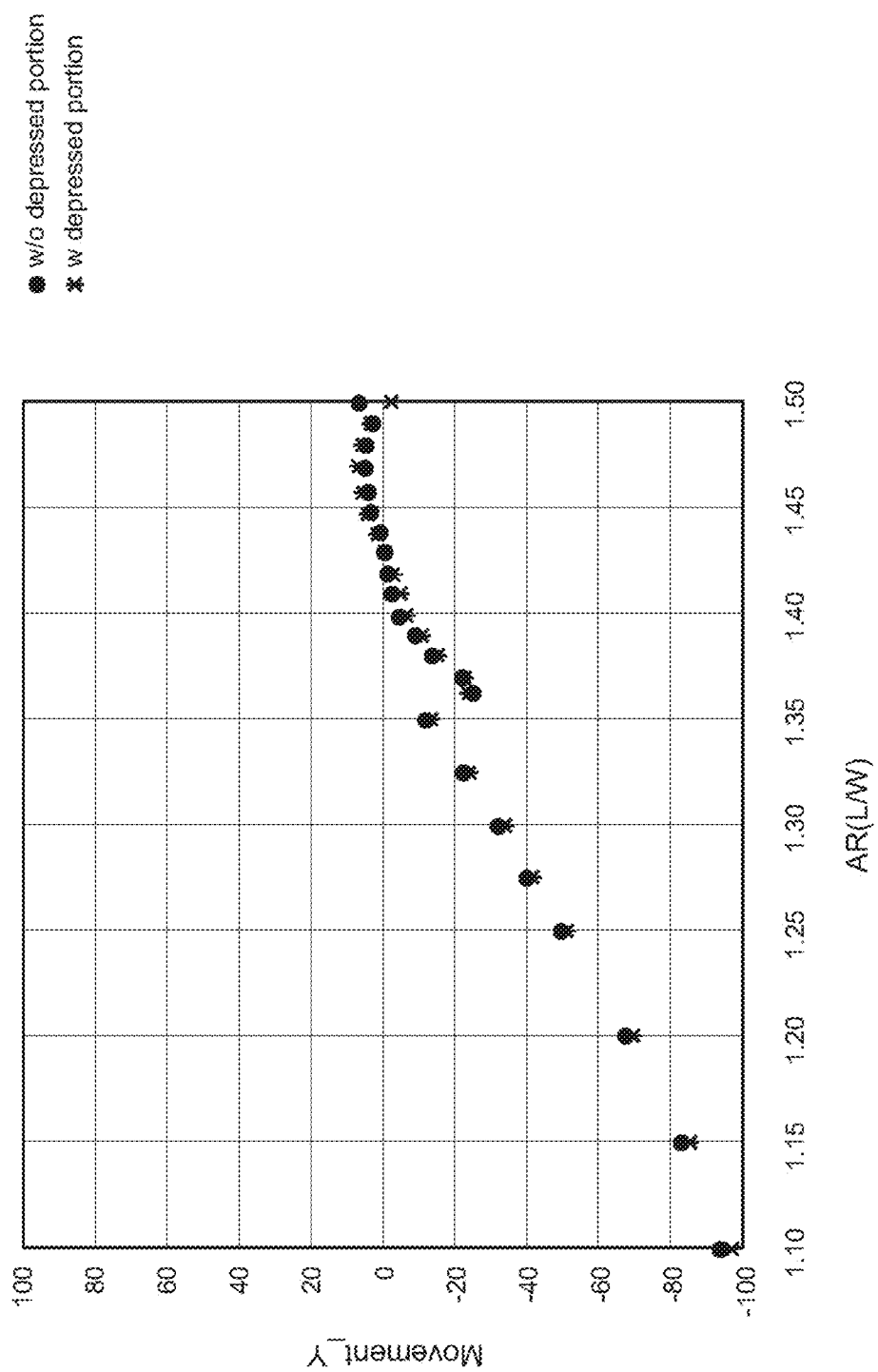
FIG. 6 is a graph illustrating an example of a relationship between the movement of a support unit in a length direction (a Y-axis direction) and the aspect ratio of a vibration member.
Figure 7:
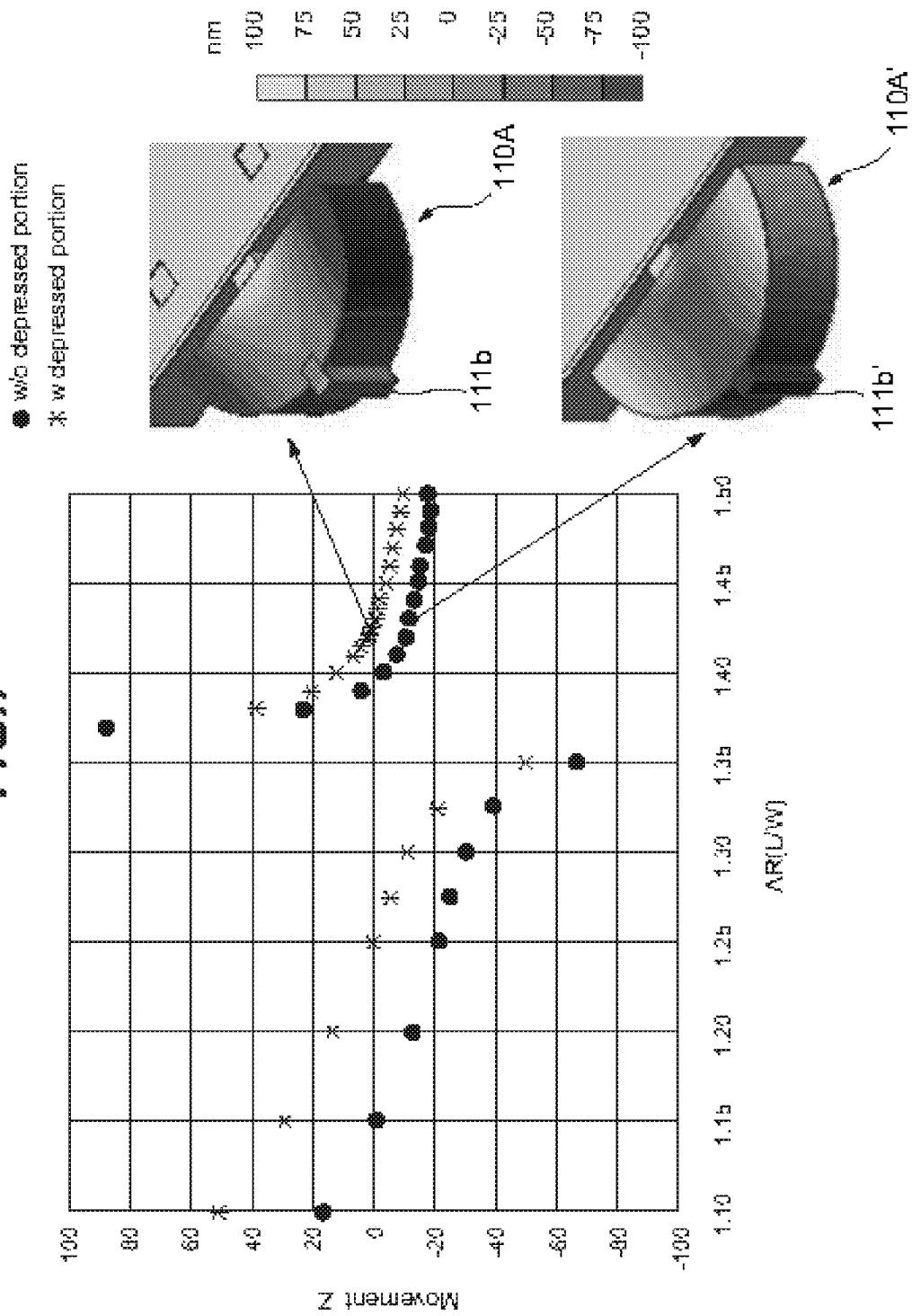
FIG. 7 is a graph illustrating an example of a relationship between the movement of the support unit in a thickness direction (a Z-axis direction) and the aspect ratio of the vibration member.

The movement of the support unit due to the vibrations of the vibration member will now be described with reference to FIG. 6 and FIG. 7. In FIG. 6 and FIG. 7, the vibration member 120 does not include the metal layer E2 illustrated in FIG. 4 and FIG. 5, but includes the compensation layer F1 that has a thickness of 0.5 μm, the Si substrate F2 that has a thickness of 24 μm, the piezoelectric thin film F3 that has a thickness of 0.8 μm, the metal layer E1 that has a thickness of 0.2 μm, and the protection film 125 that has a thickness of 0.2 μm for description. FIG. 6 is a graph illustrating an example of a relationship between the movement of the support unit 110 in the length direction (the Y-axis direction) and the aspect ratio AR of the vibration member 120. FIG. 7 is a graph illustrating an example of a relationship between the movement of the support unit 110 in the thickness direction (i.e., the Z-axis direction) and the aspect ratio AR of the vibration member 120. In FIG. 6, the horizontal axis represents the aspect ratio AR (L/W) of the vibration member 120. The vertical axis represents the amount of the movement of the support unit 110 in the length direction at a position at which the support unit 110 and the vibration member 120 are joined to each other (also simply referred to below as the "amount of the movement in the length direction"). In FIG. 7, the horizontal axis represents the aspect ratio AR (L/W) of the vibration member 120. The vertical axis represents the amount of the movement of the support unit 110 in the thickness direction at the position at which the support unit 110 and the vibration member 120 are joined to each other (also simply referred to below as the "amount of the movement in the thickness direction"). In FIG. 6 and FIG. 7, the amounts of the movement in the case where a vibration member includes no depressed portions are also illustrated by using black circles for comparison.

As illustrated in FIG. 6, as for the amount of the movement of the support unit 110 in the length direction, no apparent differences are seen in comparison between the vibration member 120 that includes the depressed portions 121 and the vibration member that includes no depressed portions. For example, in both cases, the amount of the movement of the support unit 110 in the length direction is zero when the aspect ratio is close to 1.425.

As illustrated in FIG. 7, the amount of the movement of the support unit 110 in the thickness direction is zero when the aspect ratio is close to 1.425 in the case of the vibration member 120 that includes the depressed portions 121, but is not zero when the aspect ratio is close to 1.425 in the case where the vibration member that includes no depressed portions.

Actually, in the vibration member that includes no depressed portions, the amount of the movement of the support unit 110A' in the thickness direction has a negative value at a position near a portion (e.g., an arm 111b') that is connected to a hold member, and vibrations in the thickness direction leak from the vibration member to the hold member. The amount of the movement of the support unit 110A in the thickness direction in the vibration member 120 that includes the depressed portions 121, however, has a value of approximately zero at a position near a portion (e.g., the arm 111b) that is connected to the hold member, and it can be understood that vibrations in the thickness direction are inhibited from leaking from the vibration member 120 to the hold member 140.

Figure 8:
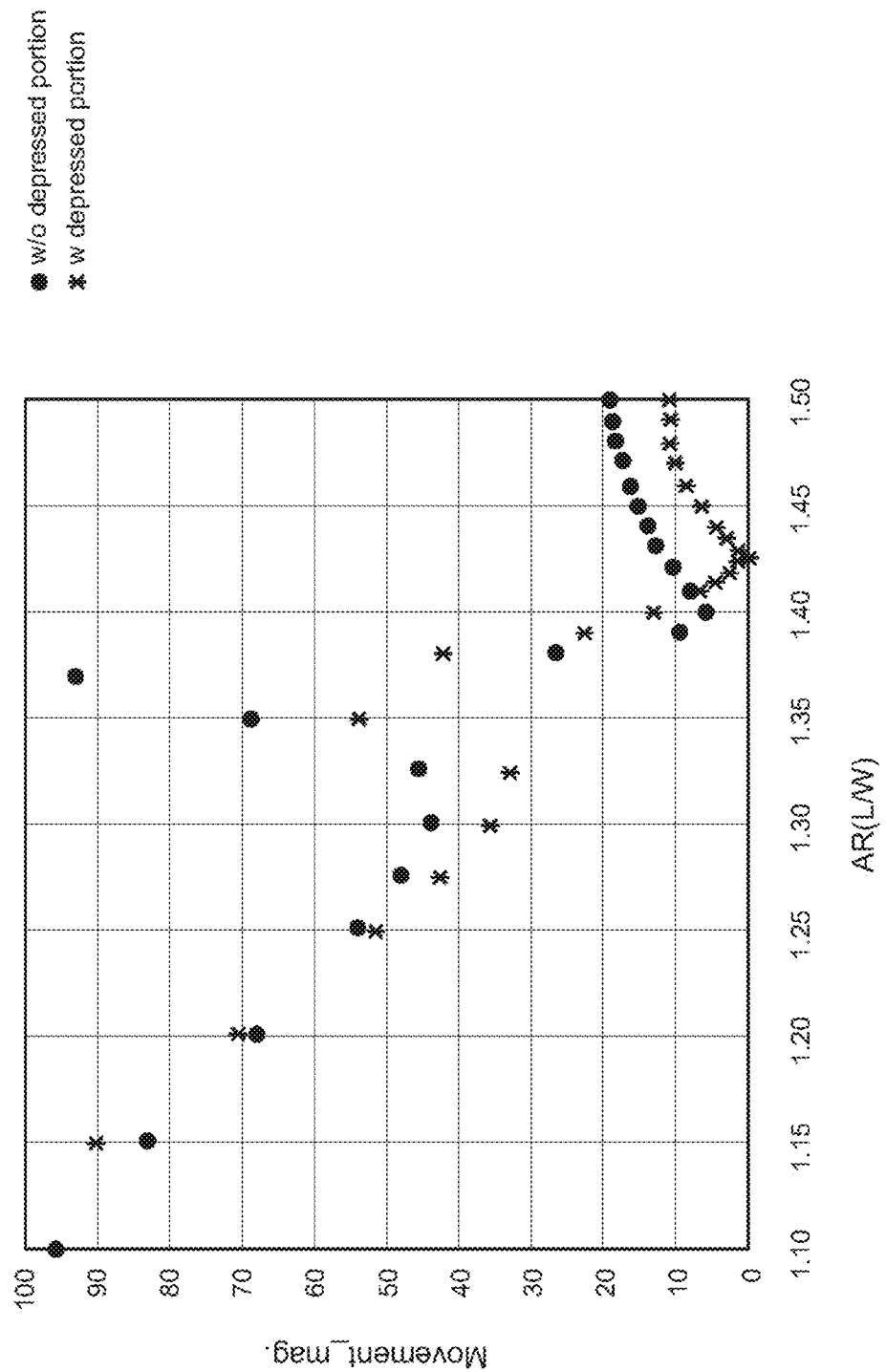
FIG. 8 is a graph illustrating an example of a relationship between the magnitude of the movement of the support unit in the thickness direction (the Z-axis direction) and the aspect ratio of the vibration member.
Figure 9:
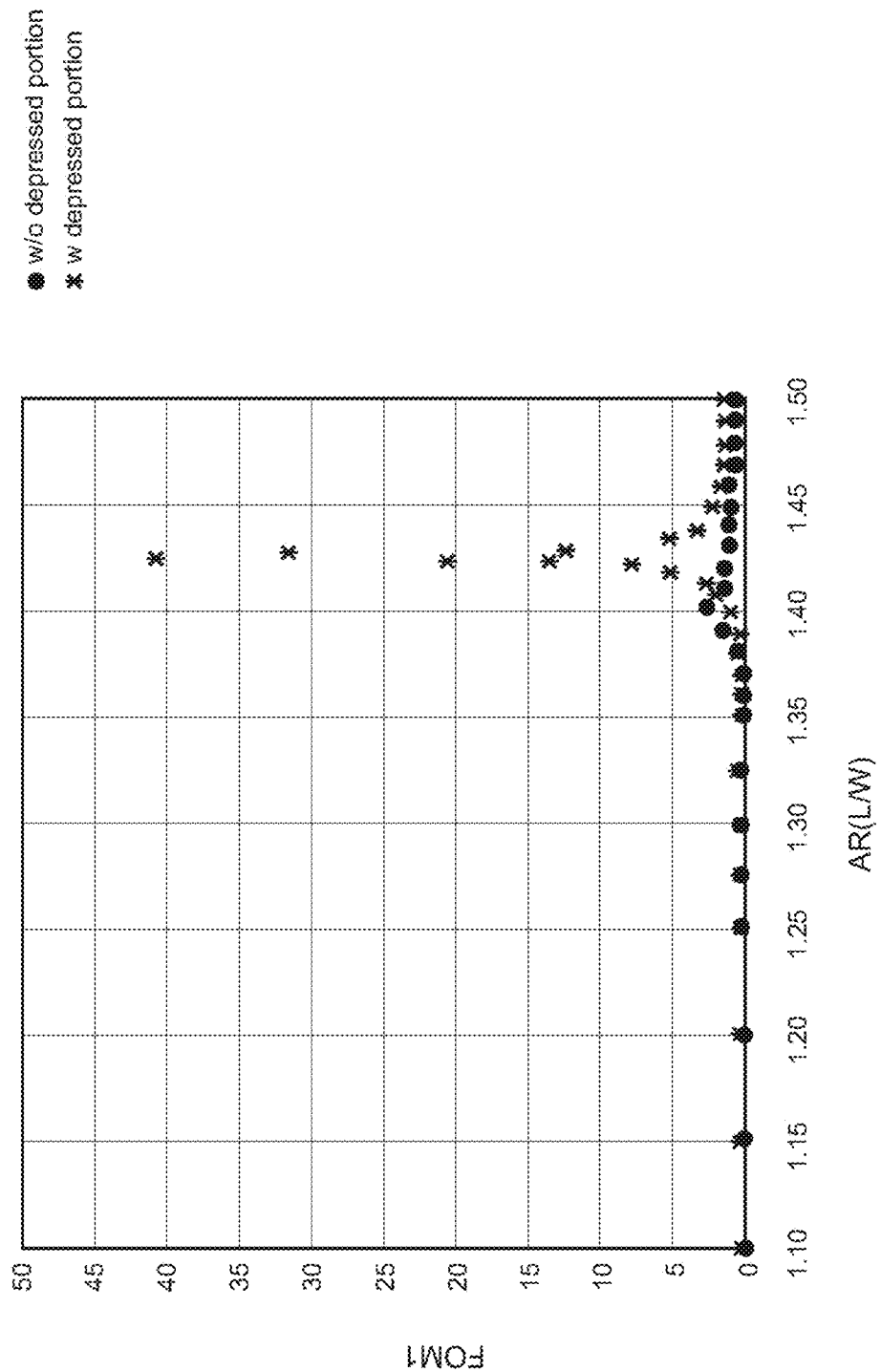
FIG. 9 is a graph illustrating an example of a relationship between an evaluation index for the support unit in the thickness direction (the Z-axis direction) and the aspect ratio of the vibration member.

The movement of the support unit in the thickness direction due to the vibrations of the vibration member will now be described by using another index with reference to FIG. 8 and FIG. 9. In FIG. 8 and FIG. 9, the vibration member 120 is the same as the vibration member 120 in FIG. 6 and FIG. 7 described above for description. FIG. 8 is a graph illustrating an example of a relationship between the magnitude of the movement of the support unit 110 in the thickness direction (i.e., the Z-axis direction) and the aspect ratio AR of the vibration member 120. FIG. 9 is a graph illustrating an example of a relationship between an evaluation index for the support unit 110 in the thickness direction (i.e., the Z-axis direction) and the aspect ratio AR of the vibration member 120. In FIG. 8, the horizontal axis represents the aspect ratio AR (L/W) of the vibration member 120. The vertical axis represents the value of a sectional area integral of the magnitude of the movement of the support unit 110 in the thickness direction. In FIG. 9, the horizontal axis represents the aspect ratio AR (L/W) of the vibration member 120. The vertical axis represents a figure of merit FOM1 that represents the value of the sectional area integral of the magnitude of the movement of the support unit 110 in the thickness direction relative to the magnitude of the maximum movement of the vibration member 120 in the thickness direction. In FIG. 8 and FIG. 9, the value of a sectional area integral and the figure of merit FOM1 in the case where a vibration member includes no depressed portions are also illustrated by using black circles for comparison.

As illustrated in FIG. 8, the vibration member 120 that includes the depressed portions 121 and the vibration member that includes no depressed portions have the minimum value when the aspect ratio is close to 1.425. When the aspect ratio is 1.425, the vibration member 120 that includes the depressed portions 121 has a value smaller than that of the vibration member that includes no depressed portions.

As illustrated in FIG. 9, when the aspect ratio is 1.425, the figure of merit FOM1 of the vibration member that includes no depressed portions is 2.4, but the figure of merit FOM1 of the vibration member 120 that includes the depressed portions 121 is 40.6. It can be understood that the vibration member 120 that includes the depressed portions 121 can improve the figure of merit FOM1 to about 17 times of that of the vibration member that includes no depressed portions.

In an example described according to the present embodiment, the vibration member 120 includes the four depressed portions 121, and each depressed portion 121 has a square shape in a plan view. However, it is noted that these configurations are not limited thereto. For example, the vibration member 120 may include a single depressed portion 121, two or three depressed portions 121, or five or more depressed portions 121 in alternative aspects. Moreover, the shape of each depressed portion 121 in a plan view may be a shape other than a square shape.

(First Modification)

FIG. 10 is a perspective view of a first modification to a structure around the vibration member 120 illustrated in FIG. 3. According to the first modification, components like to those around the vibration member 120 illustrated in FIG. 3 are designated by like reference signs, and the description thereof is appropriately omitted. The same effects achieved by the same structures are not described.

As illustrated in FIG. 10, the vibration member 120 is connected by two support units of the support unit 110A and a support unit 110B. The support unit 110A includes a node generator 130A that connects a short side of the vibration member 120 in a Y-axis negative direction and the frame body 140b of the hold member 140 to each other. The support unit 110B includes the node generator 130B that connects a short side of the vibration member 120 in a Y-axis positive direction and the frame body 140a of the hold member 140. It is also noted that the node generator 130A and the node generator 130B are the same as the node generator 130 illustrated in FIG. 2 and FIG. 3.

Moreover, the vibration member 120 includes two depressed portions 121A. Each depressed portion 121A has a semicircular shape in a plan view. As for each depressed portion 121A, parts of the protection film 125, the metal layer E1, and the piezoelectric thin film F3 illustrated in FIG. 4 are removed by, for example, etching as in the depressed portions 121. Each depressed portion 121A causes the metal layer E2 to be exposed at the bottom surface thereof.

The two depressed portions 121A are located at positions symmetrical with respect to the center line CL1 in the Y-axis direction on the vibration member 120. That is, the depressed portion 121A in the Y-axis negative direction and the depressed portion 121A in the Y-axis positive direction are formed at the positions symmetrical with respect to the center line CL1. This configuration enables the form of the movement of the vibration member 120 in the thickness direction to be readily adjusted.

(Second Modification)

Figure 11:
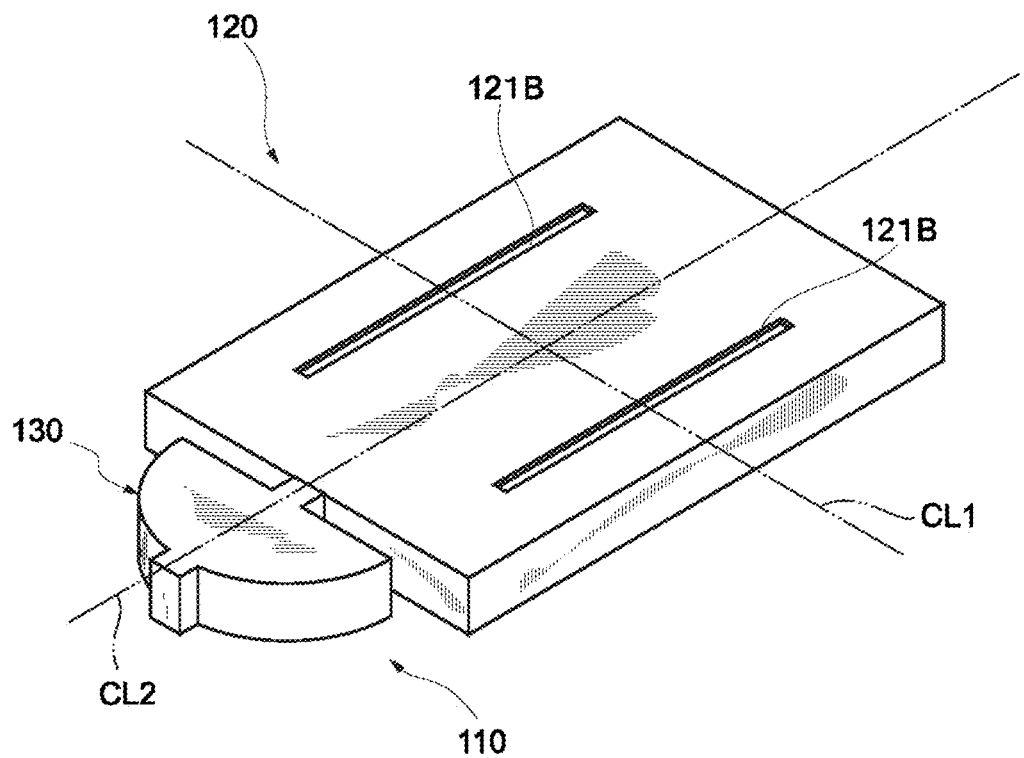
FIG. 11 is a perspective view of a second modification to the structure around the vibration member illustrated in FIG. 3.

FIG. 11 is a perspective view of a second modification to the structure around the vibration member 120 illustrated in FIG. 3. According to the second modification, components like to those around the vibration member 120 illustrated in FIG. 3 are designated by like reference signs, and the description thereof is appropriately omitted. The same effects achieved by the same structures are not described.

As illustrated in FIG. 11, the vibration member 120 includes two depressed portions 121B, and each depressed portion 121B has a belt shape that extends in the Y-axis direction in a plan view. As for each depressed portion 121B, parts of the protection film 125, the metal layer E1, and the piezoelectric thin film F3 illustrated in FIG. 4 are removed by, for example, etching as in the depressed portions 121. Moreover, each depressed portion 121B similarly causes the metal layer E2 to be exposed at the bottom surface thereof.

The two depressed portions 121B are located at positions symmetrical with respect to the center line CL2 in the X-axis direction on the vibration member 120. That is, the depressed portion 121B in an X-axis negative direction and the depressed portion 121B in the X-axis positive direction are formed at the positions symmetrical with respect to the center line CL2.

In examples described according to the modifications illustrated in FIG. 10 and FIG. 11, one of the depressed portions and the other depressed portion are formed at the positions symmetrical with respect to the center line CL1 in the Y-axis direction or the center line CL2 in the X-axis direction on the vibration member 120 but are not limited thereto. For example, as illustrated in FIG. 3, one of the depressed portions and the other depressed portion may be formed at positions symmetrical with respect to the center line CL1 in the Y-axis direction and the center line CL2 in the X-axis direction on the vibration member 120.

It is noted that the exemplary embodiments of the present invention are described above by way of example. As for a resonator according to an embodiment of the present invention, a vibration member includes a depressed portion on or above one of main surfaces of a Si substrate where a piezoelectric thin film is removed. This configuration enables the form of the movement of the vibration member in the thickness direction to be adjusted. Accordingly, vibrations are inhibited from leaking to a hold member, and the confining effect can be enhanced.

In the resonator described above, the depressed portion causes the one of the main surfaces to be exposed. This configuration readily enables the vibration member to inhibit the vibrations from leaking to the hold member.

In the resonator described above, the depressed portion causes a metal layer to be exposed. This configuration readily enables the vibration member to inhibit the vibrations from leaking to the hold member.

In the resonator described above, the depressed portion is formed at a position an offset away from a center line in the X-axis direction perpendicular to the Y-axis direction on the Si substrate in a plan view of the one of the main surfaces of the Si substrate. This configuration enables the form of the movement of the vibration member in the thickness direction to be readily adjusted.

In the resonator described above, one depressed portion and another depressed portion of depressed portions are formed at positions symmetrical with respect to a center line in the Y-axis direction and/or the center line in the X-axis direction on the Si substrate. This configuration enables the form of the movement of the vibration member in the thickness direction to be readily adjusted.

In the resonator described above, a support unit is connected to an end portion of the vibration member in the length direction. This configuration enables the vibration member that expands and contracts in the length direction and the hold member to be readily connected to each other.

In the resonator described above, the material of the substrate is silicon (Si). This configuration enables the mechanical strength of the vibration member to be increased.

In the resonator described above, the material of the substrate is degenerate silicon (Si). This configuration enables the frequency and temperature characteristics of the vibration member to be improved.

In the resonator described above, a protection film that covers a metal layer is further included. This configuration enables the metal layer that functions as an upper electrode for piezoelectric vibration, for example, to be prevented from being oxidized.

In the resonator described above, the vibration member further includes a compensation layer that is formed on the other main surface of the Si substrate. This configuration enables the change due to the temperature to be reduced, for example, at the resonant frequency of a multilayer structure that includes the Si substrate, the metal layer, the piezoelectric thin film, and the compensation layer, and the temperature characteristics of the vibration member can be improved.

A resonance device according to an exemplary embodiment of the present invention includes the resonator described above, an upper lid, and a lower lid. This configuration readily enables the resonance device to enhance the confining effect.

In general, it is noted that the exemplar are described above to make the present invention easy to understand and do not limit the present invention. The exemplary embodiments of the present invention can be modified and altered without departing from the spirit thereof. The present invention includes equivalents. That is, embodiments obtained by appropriately modifying the embodiments and/or the modifications by a person skilled in the art are included in the scope of the present invention provided that the embodiments have the features of the present invention. For example, the components according to the embodiments and/or the modifications, the arrangement thereof, the material, conditions, shape, and size are not limited to those described above by way of example and can be appropriately changed. It goes without saying that the embodiments and the modifications are described by way of example, and that the components according to the different embodiments and/or modifications can be partially replaced or combined. These having the features of the present invention are also included in the scope of the present invention.

REFERENCE SIGNS LIST 1 resonance device
10 resonator
20 lower lid
21 depressed portion
22 bottom plate
23 side wall
30 upper lid
31 depressed portion
33 side wall
110 support unit 110A support unit
110A' support unit
110B support unit
111a arm
111b arm
111b' arm
120 vibration member
121 depressed portion
121A depressed portion
121B depressed portion
125 protection film
130 node generator
130A node generator
130B node generator
131 side
140 hold member
140a frame body
140b frame body
140c frame body
140d frame body
AR aspect ratio
CL1 center line
CL2 center line
E1 metal layer
E2 metal layer
F1 compensation layer
F2 Si substrate
F3 piezoelectric thin film
FOM1 figure of merit
L length
Loff length
W width
Woff width

The invention claimed is:

1. A resonator comprising:
a vibration member that includes a substrate, a first electrode disposed on a first main surface of the substrate, and a piezoelectric layer disposed between the substrate and the first electrode, with the vibration member configured to vibrate with a main vibration being a contour vibration;
a frame that surrounds at least a portion of the vibration member; and
a support member that connects the vibration member to the frame,
wherein the vibration member includes a depressed portion on or above the first main surface of the substrate where the piezoelectric layer is removed.

2. The resonator according to claim 1, wherein the depressed portion exposes the first main surface of the substrate.

3. The resonator according to claim 1, wherein the vibration member further includes a second electrode disposed between the substrate and the piezoelectric layer.

4. The resonator according to claim 3, wherein the depressed portion exposes the second electrode.

5. The resonator according to claim 1,
wherein the vibration member vibrates with the main vibration being an expansion-contraction vibration in a first direction, and
wherein the depressed portion is disposed at a position that is offset from a center line in a second direction perpendicular to the first direction on the substrate in a plan view of the first main surface.

6. The resonator according to claim 5,
wherein the vibration member includes a plurality of the depressed portions, and
wherein a first depressed portion and a second depressed portion of the plurality of the depressed portions are disposed at positions symmetrical with respect to at least one of a center line in the first direction and the center line in the second direction on the substrate.

7. The resonator according to claim 5, wherein the support member is connected to an end of the vibration member in the first direction.

8. The resonator according to claim 1, wherein the substrate comprises silicon.

9. The resonator according to claim 8, wherein the substrate comprises a degenerate silicon.

10. The resonator according to claim 1, wherein the vibration member further includes a protection layer that covers the first electrode.

11. The resonator according to claim 1, wherein the vibration member further includes a compensation layer disposed on a second main surface of the substrate.

12. The resonator according to claim 1, wherein the depressed portion comprises four depressed portions that each have a square shape and that are symmetrically disposed with respect to each other on or above the first main surface of the substrate.

13. The resonator according to claim 7, wherein the support member comprises a node generator.

14. The resonator according to claim 13, wherein the node generator has a width that decreases as the node generator extends towards the frame, with the width being a maximum width closer to the vibration member than the frame.

15. The resonator according to claim 13, wherein the node generator comprises a semicircular shape with a center of a circle that defines an arc of the semicircular shape being located at a center of the end of the vibration member.

16. The resonator according to claim 1, further comprising:
an additional support member that connects the vibration member to the frame opposite the support member,
wherein the depressed portion comprises two depressed portions that each have a semi-circular shape that face the support member and the additional support member, respectively.

17. The resonator according to claim 1, wherein the depressed portion comprises two depressed portions that each have a belt shape extending in a lengthwise direction of the vibration member, with the two depressed portions being located at positions symmetrical with respect to a center line in the lengthwise direction of the vibration member.

18. A resonance device comprising:
the resonator according to claim 1; and
a lid.

19. A resonator comprising:
a vibration member that includes a substrate, a first electrode disposed above the substrate, and a piezoelectric layer disposed between the substrate and the first electrode, with the vibration member having a main vibration mode being a contour vibration;
a frame that surrounds at least a portion of the vibration member; and
a support member that connects the vibration member to the frame,
wherein the vibration member includes at least one depression extending through the piezoelectric layer.

20. The resonator according to claim 19, wherein the at least one depression exposes a main surface of the substrate.

* * * * *